United States Patent
Takahashi et al.

(10) Patent No.: US 10,899,615 B2
(45) Date of Patent: Jan. 26, 2021

(54) FEEDING PROCESS OF CHLORINE FLUORIDE

(71) Applicant: KANTO DENKA KOGYO CO., LTD., Tokyo (JP)

(72) Inventors: Yoshinao Takahashi, Tokyo (JP); Korehito Kato, Shibukawa (JP); Yoshimasa Sakurai, Shibukawa (JP); Hiroki Takizawa, Shibukawa (JP); Sho Kikuchi, Shibukawa (JP); Shinichi Kawaguchi, Shibukawa (JP); Yoshihiko Iketani, Shibukawa (JP); Yukinobu Shibusawa, Shibukawa (JP)

(73) Assignee: KANTO DENKA KOGYO CO., LTD., Tokyo (JP)

( * ) Notice: Subject to any disclaimer, the term of this patent is extended or adjusted under 35 U.S.C. 154(b) by 0 days.

(21) Appl. No.: 16/091,178

(22) PCT Filed: Mar. 29, 2017

(86) PCT No.: PCT/JP2017/012984
§ 371 (c)(1),
(2) Date: Oct. 4, 2018

(87) PCT Pub. No.: WO2017/175644
PCT Pub. Date: Oct. 12, 2017

(65) Prior Publication Data
US 2019/0055124 A1    Feb. 21, 2019

(30) Foreign Application Priority Data

Apr. 5, 2016 (JP) .................. 2016-075906

(51) Int. Cl.
| | |
|---|---|
| C01B 7/24 | (2006.01) |
| C07B 39/00 | (2006.01) |
| H01L 21/3065 | (2006.01) |
| H01L 21/306 | (2006.01) |
| B08B 5/00 | (2006.01) |
| B08B 9/093 | (2006.01) |

(52) U.S. Cl.
CPC ............... *C01B 7/24* (2013.01); *C07B 39/00* (2013.01); *H01L 21/3065* (2013.01);
(Continued)

(58) Field of Classification Search
CPC . C01B 7/24; H01L 21/30604; H01L 21/3065; H01L 21/02046; H01L 21/67017;
(Continued)

(56) References Cited

U.S. PATENT DOCUMENTS

| | | | |
|---|---|---|---|
| 3,363,985 A | 1/1968 | Gunderloy, Jr. et al. | |
| 3,446,592 A * | 5/1969 | Gambardella | C01B 7/24 |
| | | | 423/466 |

(Continued)

FOREIGN PATENT DOCUMENTS

| | | |
|---|---|---|
| CN | 104477849 A | 4/2015 |
| GB | 676374 A | 7/1952 |

(Continued)

OTHER PUBLICATIONS

Process for producing chlorine monofluoride, Kharitonov et al. (Year: 1984).*

(Continued)

*Primary Examiner* — Duy Vu N Deo
(74) *Attorney, Agent, or Firm* — Browdy and Neimark, PLLC (57) ABSTRACT

A chlorine fluoride feeding device and feeding process are provided that can stably generate industrially applicable chlorine fluoride (ClF), control flow rate, and provide continual feed.

The feeding process of chlorine fluoride of this invention is a feeding process to feed chlorine fluoride generated by loading a gas that contains fluorine atoms and a gas that contains chlorine atoms to a flow-type heat reactor or a plasma reactor, and it can stably generate and safely feed (Continued)

chlorine fluoride for a long time by reacting chlorine fluoride that is difficult to pack at a high pressure, such that an amount that can be packed in a gas container such as a gas cylinder is limited, with two or more types of gas materials that can be packed safely in a gas container by liquefaction, or with such gas material and a solid material.

14 Claims, 3 Drawing Sheets (52) U.S. Cl.
CPC .......... *H01L 21/30604* (2013.01); *B08B 5/00* (2013.01); *B08B 9/093* (2013.01)

(58) Field of Classification Search
CPC ......... H01L 21/67098; H01L 21/67253; H01L 2924/01009; H01L 2924/01017; B08B 5/00; B08B 9/093; C07B 39/00
See application file for complete search history.

(56) References Cited

U.S. PATENT DOCUMENTS

| | | | |
|---|---|---|---|
| 6,929,784 B1* | 8/2005 | Bhardwaj | B01J 7/00 257/E21.218 |
| 8,382,940 B2 | 2/2013 | Laermer | |
| 2004/0069610 A1 | 4/2004 | Arno et al. | |
| 2005/0020071 A1 | 1/2005 | Sonobe et al. | |
| 2005/0039815 A1* | 2/2005 | Tanaka | F17C 7/04 141/1 |
| 2005/0252451 A1* | 11/2005 | Beppu | C23C 16/4405 118/719 |
| 2006/0006057 A1 | 1/2006 | Laermer | |

FOREIGN PATENT DOCUMENTS

| | | |
|---|---|---|
| GB | 1155980 A | 6/1969 |
| JP | 2002-538068 A | 11/2002 |
| JP | 2005-531479 A | 10/2005 |
| JP | 2007-191378 A | 8/2007 |
| JP | 2011-26694 A | 2/2011 |
| RU | 2223908 C1 | 2/2004 |
| TW | 200413111 A | 8/2004 |

OTHER PUBLICATIONS

International Search Report of PCT/JP2017/012984.
European Search Report for European application No. 17779023.5 dated Oct. 21, 2019.
European Search Report for EP 17779023.5, dated Jan. 27, 2020.

* cited by examiner

FEEDING PROCESS OF CHLORINE FLUORIDE

TECHNICAL FIELD

The present invention relates to a feeding process of chlorine fluoride, and usages of the chlorine fluoride that was fed. It relates to a process for feeding chlorine fluoride stably and safely, over a long time, chlorine fluoride being a highly corrosive gas that is difficult to be packed in a gas container, such as a gas cylinder, at high pressure.

BACKGROUND ART

Chlorine fluoride may be used for cleaning a semiconductor manufacturing device or etching a semiconductor manufacturing device during its manufacture. In addition to semiconductors, chlorine fluoride may be used for manufacturing a MEMS device, a liquid crystal device, or solar cell device. Additionally, it may be used for manufacturing organic fluorides or inorganic fluorides.

However, chlorine fluoride is highly corrosive/toxic, and a compressed gas, so it is difficult to be packed at high pressure in containers for transporting gas, such as a gas cylinder, and be circulated. This is because corrosion of the container material is promoted by gas packed at high pressure, so that there is danger of gas leaking out and the container being damaged.

Although chlorine fluoride is a useful gas, it cannot be packed in a gas container at high pressure, so the packed amount per container was small, the cost of transportation was large, and the work for exchanging the container increased.

Patent Document 1 discloses a feeding process relating to fluorine gas, which is highly corrosive and toxic, and difficult to handle, similar to chlorine fluoride, that feeds fluorine gas generated by a pyrolysis reaction of a metal fluoride solid.

In the process described in this conventional invention, which is to generate fluorine by pyrolysis of a metal fluoride solid, the generation amount and the flow rate of the generated fluorine gas is controlled by the reaction rate of the pyrolysis reaction, and a large amount of a metal fluoride solid must be used or a high temperature pyrolysis condition must be adopted when a large amount of gas is needed. A use of a large amount of metal fluoride solid requires a larger reactor and a more efficient heating mechanism. An adoption of a high temperature condition may cause damage to the reactor by corrosion due to the generated fluorine.

By adopting a process of reacting two or more gas materials or a process of reacting a gas material with a solid material in the present invention, it becomes possible to feed chlorine fluoride stably, over a long time, even under a condition that requires a large amount of chlorine fluoride.

Patent Document 2 discloses a semiconductor manufacturing facility that includes a fluorine gas generating device that generates fluorine gas by electrolysis of a molten salt that contains hydrogen fluoride.

In this generation process described in the prior invention, which is to generate fluorine gas by electrolysis of a molten salt that contains hydrogen fluoride, hydrogen is generated in addition to fluorine at an amount of substance almost equal to fluorine, so a mechanism for safely discharging hydrogen is essential. Further, hydrogen fluoride used as the starting material, with a boiling point of 19.5° C., can readily liquefy and may cause a serious chemical injury when the solution spatters, so it is dangerous. Furthermore, generating chlorine fluoride by such an electrolysis method is difficult and not readily achievable.

The present invention generates chlorine fluoride by adopting a process of reacting two or more types of gas materials, or a process of reacting a gas material and a solid material using a simple reactor, and a generation device to generate material gas may be used in addition to the gas container filled with the material gas when using two types of gas materials, so the present invention can be performed without a dangerous gas material. Also, although a solid residue remains in the reactor when the gas material and solid material are used, there is no danger of it leaking out since it is a solid, and the reactivity of the solid residue is low relative to the solid material. Hence, as shown above, the present invention enables chlorine fluoride to be fed more safely, and with a simpler device, than the prior invention.

CITATION LIST

Patent Documents

[Patent Document 1] JP 2007-191378 A
[Patent Document 2] JP 2011-26694 A

SUMMARY OF INVENTION

Problem to be Solved by the Invention

Chlorine fluoride (hereinafter referred to as ClF) is an extremely useful gas that may be used as a cleaning gas for residues such as silicon deposited on the inside of the semiconductor manufacturing device, or as a fluorination agent for fluorination by halogen exchange in an organic synthesis reaction. However, chlorine fluoride is a compressed gas at normal temperature, and has high oxidizability, so it exhibits corrosiveness, toxicity, and a combustion supporting property. These features make it difficult and dangerous to pack ClF at a high pressure in a commonly used gas container, such as a gas cylinder, for transporting gas, unequipped with a cooling mechanism, so the amount of chlorine fluoride to be packed in a container such as a gas cylinder is smaller than other gases.

It is anticipated that in a use requiring a large amount of chlorine fluoride for cleaning the inside of the semiconductor manufacturing device or for a synthesis material, feeding gas from a container filled with little content results in an increased frequency of container exchange, and impedes the feed of chlorine fluoride over a long time. In addition to the troublesome work of frequently exchanging the containers, there exists an increased possibility of the highly corrosive and toxic chlorine fluoride leaking out and endangering the users.

Fluorine gas (hereinafter referred to as $F_2$) having a high oxidizability, and an extremely high corrosiveness and toxicity, and prone to danger, similar to chlorine fluoride, has a problem similar to chlorine fluoride as mentioned above, and a process is proposed of generating and feeding fluorine from materials other than fluorine by methods shown in Patent Document 1 or Patent Document 2.

However, chlorine fluoride differs from fluorine and contains one each of a fluorine atom and a chlorine atom in its molecular composition, so there is difficulty in selectively generating chlorine fluoride by a pyrolysis reaction of a single material, such as a metal fluoride solid, and the same is true of an electrolytic generation process such as an electrolysis of a molten salt containing hydrogen fluoride.

The feeding process of chlorine fluoride in the present invention sets out to solve the above problem, and provides a process of feeding chlorine fluoride to a semiconductor manufacturing device or a synthesis reactor, in a large amount, stably, over a long time.

Solution to Problem

The present inventors performed extensive studies to achieve the above object, and developed a process using a simple operation to feed chlorine fluoride having an oxidizability equivalent to fluorine and a strong corrosiveness, in a large amount, and stably over a long time. This process, relating to chlorine fluoride which is inherently difficult to pack at high pressure and may be packed in a gas container such as a gas cylinder in a limited amount, enables a stable generation and an extended, safe feed of chlorine fluoride, by reacting two or more types of gas materials that can be packed safely in a gas container in a liquefied state, or such gas material and a solid material.

The present invention provides the following embodiments.

[1]
A feeding process of chlorine fluoride that feeds chlorine fluoride generated by loading a gas that contains fluorine atoms and a gas that contains chlorine atoms as starting materials into a flow-type reactor, the process comprising:
adjusting a flow rate of the gas that contains fluorine atoms and the gas that contains chlorine atoms, which are starting materials, to adjust a flow rate of chlorine fluoride to be fed.

[2]
The feeding process according to [1], wherein the flow-type reactor is at least one type selected from a group consisting of a flow-type heat reactor and a flow-type reactor equipped with a plasma generation device.

[3]
The feeding process according to either [1] or [2] provided with: a storage mechanism, situated downstream of the reactor, for storing a generated chlorine fluoride by liquefying the generated chlorine fluoride through cooling; a pressure adjustment mechanism, situated further downstream, for adjusting pressure of gas; and a flow rate control mechanism, situated even further downstream, for controlling a gas flow rate, the process comprising:
temporarily liquefying the generated chlorine fluoride; and
heating the storage mechanism when feeding chlorine fluoride to gasify chlorine fluoride; and
feeding chlorine fluoride stably by use of the pressure adjustment mechanism and the flow rate control mechanism.

[4]
A feeding process of chlorine fluoride that feeds chlorine fluoride generated by loading a gas that contains chlorine atoms into a heat reactor which is loaded with a metal salt that contains fluorine atoms or metal fluorides, which are starting materials, the process comprising:
adjusting a flow rate of the gas that contains chlorine atoms to be loaded to the reactor to adjust a flow rate of the chlorine fluoride to be fed.

[5]
The feeding process according to [4] provided with: a storage mechanism, situated downstream of the reactor, for storing a generated chlorine fluoride by liquefying the generated chlorine fluoride through cooling; a pressure adjustment mechanism, situated further downstream, for adjusting pressure of gas; and a flow rate control mechanism, situated even further downstream, for controlling a gas flow rate, the process comprising:
temporarily liquefying the generated chlorine fluoride; and
heating the storage mechanism when feeding chlorine fluoride to gasify chlorine fluoride; and
feeding chlorine fluoride stably by use of the pressure adjustment mechanism and the flow rate control mechanism.

[6]
The feeding process according to any one of [1] to [3], wherein the gas that contains fluorine atoms, which is a starting material, is a compound represented by $F_2$ or $XF_n$ (wherein X is Cl, Br or I, and n is an integer of 3 to 7), and the gas that contains chlorine is at least one type of gas selected from $Cl_2$, $NCl_3$, and $BCl_3$.

[7]
The feeding process according to [6], wherein the compound represented by $XF_n$ is at least one type of gas selected from $ClF_3$, $ClF_5$, $BrF_3$, $BrF_5$, $IF_5$, and $IF_7$.

[8]
The feeding process according to either [4] or [5], wherein the metal salt that contains fluorine atoms, which is a starting material, is at least one type selected from $Na_xM_yF_z$ or $K_xM_yF_z$ (wherein M is any metal atom, and x, y, z is a positive number larger than 0), or a metal fluoride salt in which metal fluoride is represented by $MF_n$ (wherein M is any metal atom, and n is a positive number larger than 0), and the gas that contains chlorine is at least one type of gas selected from $Cl_2$, $NCl_3$, $BCl_3$.

[9]
The feeding process according to any one of [1] to [3] comprising:
passivating a surface inside a heat reactor by loading $F_2$ gas into the heat reactor;
reducing pressure of gases from a gas cylinder of the gas that contains fluorine atoms and a gas cylinder of the gas that contains chlorine atoms by a pressure control mechanism situated immediately downstream of the gas cylinders;
controlling the flow rate of the gas that contains fluorine atoms and the flow rate of the gas that contains chlorine atoms;
heating the heat reactor to 200 to 400° C. and loading the gas that contains fluorine atoms and the gas that contains chlorine atoms to the heat reactor to generate chlorine fluoride;
controlling pressure in the heat reactor by a pressure adjustment mechanism, situated downstream of the heat reactor; and
controlling a feed flow rate of chlorine fluoride.

[10]
The feeding process according to either [4] or [5], comprising:
passivating a surface inside a heat reactor by loading $F_2$ gas into the heat reactor;
reducing pressure of gas from a gas cylinder of the gas that contains chlorine atoms by a pressure adjustment mechanism situated immediately downstream of the gas cylinder;
controlling the flow rate of the gas that contains chlorine atoms;
heating the heat reactor to 200 to 400° C. and loading the gas that contains chlorine atoms to the heat reactor to generate chlorine fluoride;

controlling pressure in the heat reactor by a pressure adjustment mechanism, situated downstream of the heat reactor; and controlling a feed flow rate of chlorine fluoride.

[11]

The feeding process according to any one of [1] to [10], wherein a composition of a generated chlorine fluoride is as follows: ClF at 50.000 to 99.999 vol %, a total amount of halogen molecules represented by $X_2$ (X=F, Cl, Br, I) at 0.000 to 20.000 vol %, $ClF_3$ at 0.000 to 20.000 vol %, a total amount of molecules represented by HX (X=F, Cl, Br, I) at 0.000 to 10.000 vol %, and a balance that contains at least one type of $O_2$, $CO_2$, $N_2$.

[12]

A cleaning process comprising cleaning an inside of a semiconductor manufacturing device by chlorine fluoride fed by the feeding process according to any one of [1] to [10].

[13]

An etching process comprising etching a surface of a semiconductor substrate by chlorine fluoride fed by the feeding process according to any one of [1] to [10].

[14]

An organic synthesis process that uses chlorine fluoride fed by the feeding process according to any one of [1] to [10] in an organic synthesis reaction.

[15]

A fluorinating process comprising subjecting a reaction substrate to a fluorination reaction using chlorine fluoride fed by the feeding process according to any one of [1] to [10].

Advantageous Effect

The present invention solves the problems associated with the conventional process of feeding chlorine fluoride from a gas container such as a gas cylinder, and provides a feeding process that can feed chlorine fluoride in a large amount, and stably over a long time.

The feeding process of chlorine fluoride of the present invention provides the following effects.

(1) It can reduce the number of times the container is exchanged, which is a dangerous activity, since it can feed chlorine fluoride in a large amount and stably over a long time, relative to the process of feeding chlorine fluoride directly from a gas container such as a gas cylinder.

(2) The chlorine fluoride generated by the present invention is fed at approximately the atmospheric pressure, when there is no mechanism for cooling and storing chlorine fluoride downstream of the reactor, so there is less danger of leakage and corrosion under high pressure, and it is safer.

(3) It can feed chlorine fluoride even when it is difficult to obtain chlorine fluoride packed in a gas container such as a gas cylinder.

DESCRIPTION OF EMBODIMENTS

The feeding process and feeding device of chlorine fluoride according to the present invention are described below.

FIGS. 1 to 4 show an example of a chlorine fluoride feeding device that can perform the feeding process of chlorine fluoride of the present invention.

Firstly, explained below is the constitution of a chlorine fluoride feeding device shown in FIG. 1. The feeding device consists of the following: a gas container (1) filled with a gas material that contains fluorine atoms; a gas container (2) filled with a gas material that contains chlorine atoms; pressure control devices (3, 4) controlling the pressure of the gas material fed from the gas container or a gas generation device; flow rate control devices (5, 6) controlling the flow rate of the gas material; a reactor (7) having a heat mechanism or a plasma generation mechanism, or both; a pressure control device (8) controlling an increase in pressure by discharging the inside gas out of the system when the pressure inside the reactor increases beyond the predetermined level; a flow rate control device (10) controlling the flow rate of chlorine fluoride fed from the reactor (7); and a pressure control device (9) retaining at a constant level the pressure of chlorine fluoride fed to the flow rate control device. Although not shown in the diagram, it is preferred from a safety perspective to implement a piping for replacing the inside of the device with an inert gas such as nitrogen, a vacuum pump, a pressure gage for measuring the pressure inside the device, and a thermometer for measuring the temperature inside the device.

Explained next is the constitution of a chlorine fluoride feeding device shown in FIG. 2. The feeding device consists of the following: a gas container (2) filled with a gas material that contains chlorine atoms; a pressure control device (4) controlling the pressure of the gas material fed from the gas container or the gas generation device; a flow rate control device (6) controlling the flow rate of the gas material; a reactor (11) having a heat mechanism and loaded with a metal salt that contains fluorine atoms or a metal fluoride; a pressure control device (8) controlling an increase in pressure by discharging the inside gas out of the system when the pressure inside the reactor increases beyond the predetermined level; a flow rate control device (10) controlling the flow rate of chlorine fluoride fed from the reactor (7); and a pressure control device (9) retaining at a constant level the pressure of chlorine fluoride fed to the flow rate control device. The method for loading the metal salt or the metal fluoride includes, for example, placing the object inside the device, or filling the device. Although not shown in the diagram, it is preferred from a safety perspective to implement a piping for replacing the inside of the device with an inert gas, such as nitrogen, a vacuum pump, a pressure gage for measuring the pressure inside the device, and a thermometer for measuring the temperature inside the device.

Explained next is the constitution of a chlorine fluoride feeding device shown in FIG. 3. The feeding device consists of the following: a gas container or a gas generation device (1) filled with a gas material that contains fluorine atoms; a gas container or a gas generation device (2) filled with a gas material that contains chlorine atoms; pressure control devices (3, 4) controlling the pressure of the gas materials fed from the respective gas containers; flow rate control devices (5, 6) controlling the flow rate of the gas material; a reactor (7) having a heat mechanism or a plasma generation mechanism, or both; a storage device (12) having a storage mechanism for storing chlorine fluoride generated from the reactor by liquefying chlorine fluoride through cooling; a pressure control device (9) controlling the pressure of the chlorine fluoride while feeding the stored chlorine fluoride; and a flow rate control device (10) controlling the flow rate of chlorine fluoride. Although not shown in the diagram, it is preferred from a safety perspective to implement a piping for replacing the inside of the device with an inert gas such as nitrogen, a vacuum pump, a pressure gage for measuring the pressure inside the device, and a thermometer for measuring the temperature inside the device.

Lastly, explained below is the constitution of a chlorine fluoride feeding device shown in FIG. 4. The feeding device consists of the following: a gas container or a gas generation device (2) filled with a gas material that contains chlorine atoms; a pressure control device (4) controlling the pressure of the gas material fed from the gas container or the gas generation device; a flow rate control device (6) controlling the flow rate of the gas material; a reactor (8) having a heat mechanism and loaded with a metal salt that contains fluorine atoms or a metal fluoride; a storage device (12) having a storage mechanism for storing chlorine fluoride generated from the reactor by liquefying it through cooling; a pressure control device (9) controlling the pressure of the chlorine fluoride while feeding the stored chlorine fluoride; and a flow rate control device (10) controlling the flow rate of chlorine fluoride. The method for loading the metal salt or the metal fluoride includes, for example, placing the object inside the device, or filling the device. Although not shown in the diagram, it is preferred from a safety perspective to implement a piping for replacing the inside of the device with an inert gas such as nitrogen, a vacuum pump, a pressure gage for measuring the pressure inside the device, and a thermometer for measuring the temperature inside the device.

Figure 1:
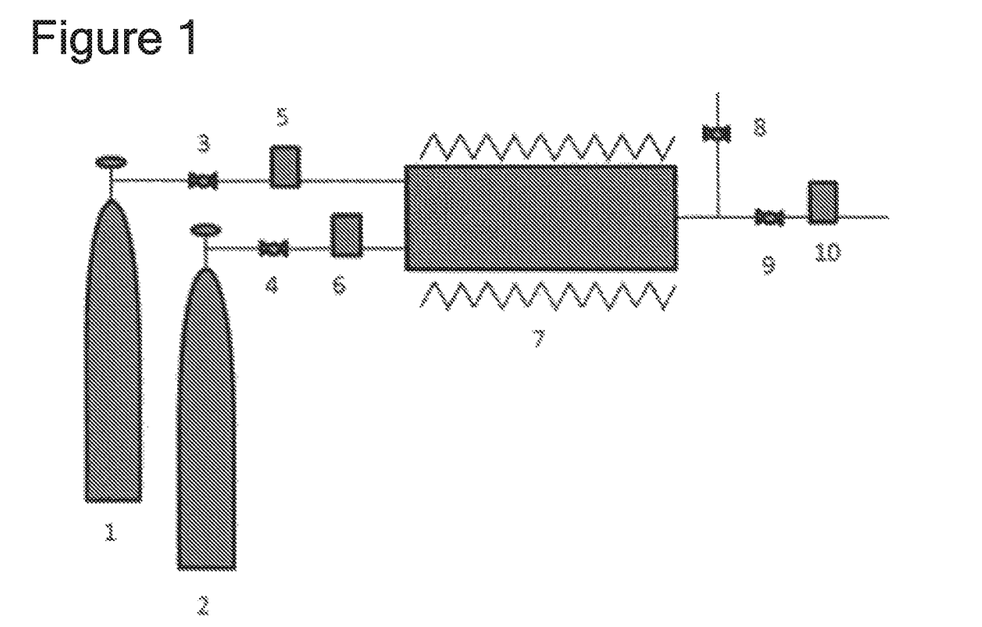
FIG. 1 is a diagram showing an example of a chlorine fluoride feeding device that can perform the feeding process of chlorine fluoride of the present invention.
Figure 2:
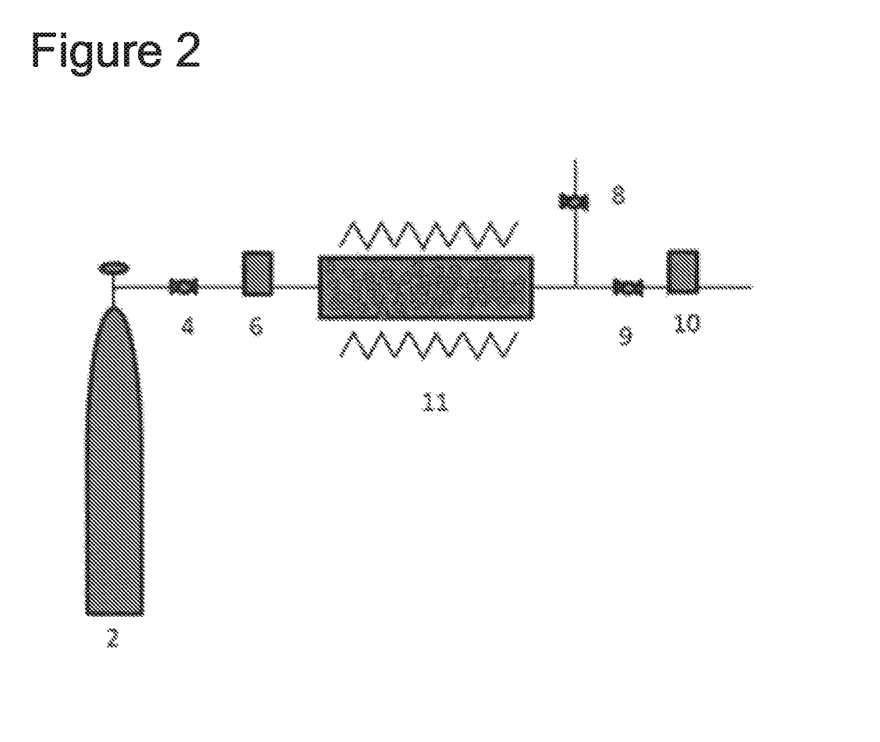
FIG. 2 is a diagram showing an example of a chlorine fluoride feeding device that can perform the feeding process of chlorine fluoride of the present invention.

In the chlorine fluoride feeding device shown in FIG. 1 and FIG. 2, the amount of the material gas to be loaded can be adjusted to an amount that generates not less than 1.01 folds of the amount of chlorine fluoride to be fed to feed chlorine fluoride stably. The pressure of the reactor (7) increases due to the amount of the loaded starting material being larger than the feed, but when the pressure rises above a certain level, the excessive chlorine fluoride is discharged by the pressure control device (8) and the pressure inside the reactor is retained. The amount of the loaded material gas is more preferably adjusted to an amount that generates 1.01 to 1.20 folds of chlorine fluoride. Further, the pressure control range inside the reactor is preferably 0.1 to 1.0 MPa.

The material of the feeding device of the present invention is not particularly limited as long as it has corrosion resistance against gas with strong corrosiveness, such as fluorine, and chlorine fluoride, and has a sufficient mechanical strength such that it is not fractured by temperature change or a rapid change in the inside pressure, and includes SUS316, nickel, HASTELLOY, Monel, alumina, alumite, quartz, etc.

Figure 3:
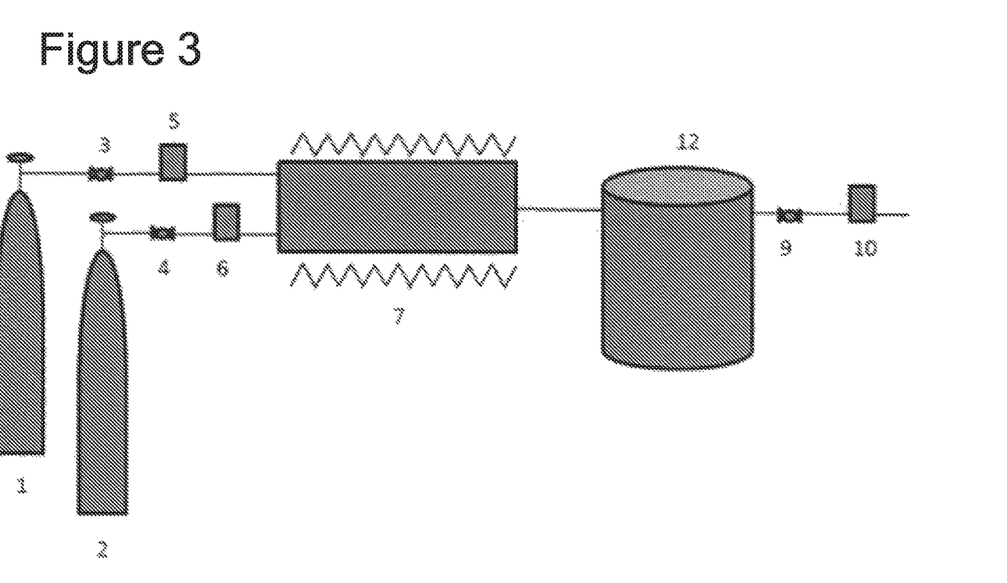
FIG. 3 is a diagram showing an example of a chlorine fluoride feeding device that can perform the feeding process of chlorine fluoride of the present invention.

In the feeding process using a feeding device of FIG. 1 or FIG. 3 of the present invention, the gas that contains fluorine atoms, constituting the starting material, is preferably a compound represented by $F_2$ or $XF_n$ (wherein X is Cl, Br or I, and n is an integer of 3 to 7), and gas selected from $ClF_3$, $ClF_5$, $BrF_3$, $BrF_5$, $IF_5$, $IF_7$, etc. may be used as the starting material, of which $ClF_3$ is most preferable. With regards to the gas that contains chlorine atoms, the gas selected from $Cl_2$, $NCl_3$, $BCl_3$ may be used as the starting material, of which $Cl_2$ is preferable. These gas materials may be fed not just from a gas container such as a gas cylinder, but also through forming a connection to a feeding device feeding the gas material.

Figure 4:
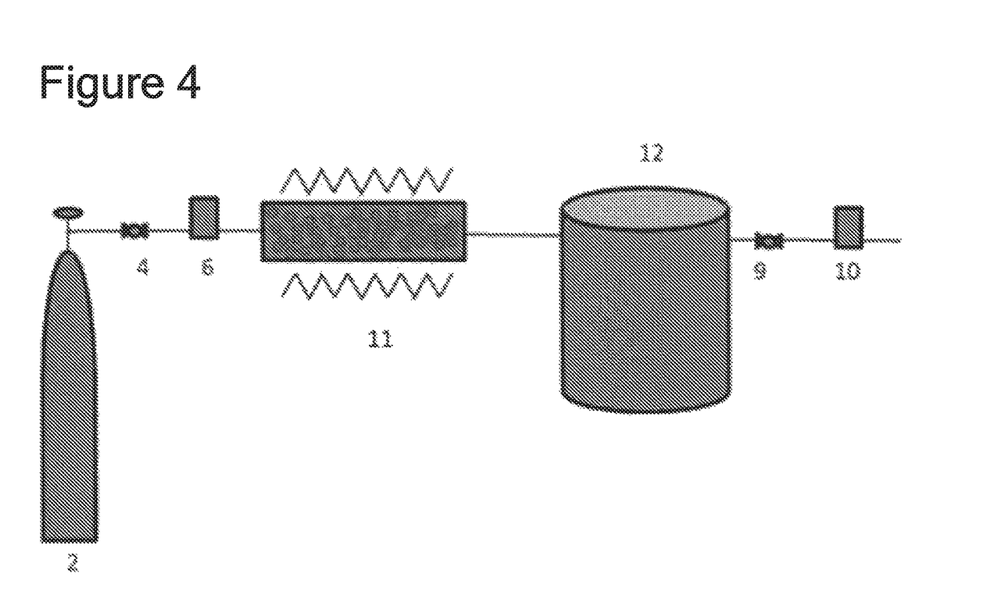
FIG. 4 is a diagram showing an example of a chlorine fluoride feeding device that can perform the feeding process of chlorine fluoride of the present invention.

In the feeding process using a feeding device of FIG. 2 or FIG. 4 of the present invention, the metal salt that contains fluorine atoms, constituting the starting material, may be $Na_xM_yF_z$ or $K_xM_yF_z$ (wherein M is any metal atom, and x, y, z are positive numbers larger than 0), or metal fluoride salts in which metal fluoride is represented by $MF_n$ (wherein M is any metal atom, and n is a positive number larger than 0), of which AgF is preferable. With regards to the gas that contains chlorine atoms, the gas selected from $Cl_2$, $NCl_3$, $BCl_3$ may be used as the starting material, of which $Cl_2$ is preferable. These gas materials may be fed not just from a gas container such as a gas cylinder, but also by forming a connection to a feeding device feeding the gas material.

The possible flow rate range for feeding chlorine fluoride in the present invention is not particularly limited, and the flow rate may be adjusted by the flow rate of gas material in the device of FIGS. 1 and 2, and by the flow rate control device (11) situated downstream of the storage device in the device of FIGS. 3 and 4.

The heat mechanism and plasma generation mechanism provided on the reactors (7, 8) reacting the gas material or the gas material and the solid material in a feeding device of chlorine fluoride of the present invention are not particularly limited as long as the materials react efficiently and chlorine fluoride is stably generated, and the heat mechanism and the plasma generation mechanism may be used in combination. A reaction utilizing optical excitation may also be applied, and providing a light source for optical excitation in addition to the heat mechanism or the plasma generation mechanism enables a more efficient generation of chlorine fluoride.

The storage device (9) in the feeding device of chlorine fluoride of the present invention, having a storage mechanism for storing chlorine fluoride by liquefying it through cooling, is not particularly limited as long as the storage device (9) may cool chlorine fluoride to the boiling point of chlorine fluoride (−100° C.) or lower, has a cooling capacity to quantitatively liquefy chlorine fluoride generated by the reactor, and has a temperature adjustment mechanism that can adjust the pressure of chlorine fluoride to 0 MPaG or higher when feeding chlorine fluoride from the storage device (9). When storing chlorine fluoride, it is particularly preferable for the storage device to be filled with liquid nitrogen, or liquid helium, and be cooled to −110 to −190° C. When storing chlorine fluoride, it is particularly preferable to adjust the temperature to −100 to 20° C., and the pressure of chlorine fluoride to 0 to 3 MPaG.

To the feeding device of chlorine fluoride of the present invention may be installed a purifying device filled with an adsorbent that adsorbs hydrogen fluoride or hydrogen chloride to purify chlorine fluoride, and the purifying device is preferably installed downstream of the reactors (7, 8), a section between the reactors (7, 8) and the storage device (9), or a section between the storage device (9) and the pressure control device (10). The adsorbent to fill this purifying device may include NaF, KF. It is also preferable for this purifying device to have a mechanism to recover the absorbable state of the filler by heating when the filler loses its capacity to adsorb hydrogen fluoride.

In the feeding process of chlorine fluoride of the present invention, a gas having the following composition may be obtained.

ClF: 50.000 to 99.999 vol %,

Total amount of a halogen molecule represented by $X_2$ (X=F, Cl, Br, I): 0.000 to 20.000 vol %, particularly 0.0001 to 20.000 vol %, $ClF_3$: 0.000 to 20.000 vol %, particularly 0.0001 to 20.000 vol %, Total amount of a halogen molecule represented by HX (X=F, Cl, Br, I): 0.000 to 10.000 vol %, particularly 0.0001 to 10.000 vol %, and Balance of at least one of $O_2$, $CO_2$, $N_2$.

A more specific procedure for carrying out the feeding process of chlorine fluoride of the present invention is exemplified below.

(Procedure for Generating Chlorine Fluoride)

1. The $F_2$ gas cylinder is attached to the device; the inside of the device is evacuated by a pump; then nitrogen is loaded to atmospheric pressure. This operation is performed 10 times to remove remaining air and water from the inside of the device.

2. The inside of the device is evacuated by a pump; $F_2$ is loaded to atmospheric pressure and remaining water is removed from the inside of the device; and also passivation is performed by fluorinating the metal surface, which is the device material, and achieving a corrosion resistant state.

3. When $F_2$ is loaded to atmospheric pressure, the system is left standing for 3 hours or more in that state.

4. The inside of the device is evacuated by a pump, then nitrogen is loaded to atmospheric pressure. The operation is continued 10 times or more and fluorine inside the device is replaced with nitrogen.

5. The $F_2$ gas cylinder is removed; the material gas cylinder is attached; the piping section opened to the atmosphere is evacuated by a pump; then nitrogen is loaded to atmospheric pressure. This operation is performed 10 times; and air and water diffused inside the device is removed by opening to the atmosphere.

6. The gas cylinder valve of the material gas cylinder is opened; and pressure is reduced by the regulator situated immediately downstream of the gas cylinder.

7. The flow rate of the material gas is controlled by a mass flow controller controlled by a computer. The flow rate of the material gas at this time is preferably a flow rate that generates chlorine fluoride that is at least 1.01 folds the feed amount of chlorine fluoride to be fed.

8. The reactor is heated to a predetermined temperature (200 to 400° C.); two types of material gas are loaded; the gas generated from the outlet of the reactor is analyzed (by gas chromatography or FT-IR); and it is confirmed that chlorine fluoride is in the desired composition.

9. The pressure in the reactor is controlled by a regulator situated downstream of the reactor and a digital regulator controlled by a computer, and the feed flow rate of chlorine fluoride is controlled by a mass flow controller.

EXAMPLES

The present invention is described in more detail below by Examples and Comparative Examples, without being limited thereby.

Example 1

The feed time was measured of chlorine fluoride that was made to flow at 900 sccm using a chlorine fluoride feeding device shown in FIG. 1. As 1 (a gas container of material gas that contains fluorine atoms) of FIG. 1 was used a SUS 40 L gas cylinder filled with 40 kg of $ClF_3$. As 2 (a gas container of material gas that contains chlorine atoms) was used a manganese steel 47 L gas cylinder filled with 50 kg of $Cl_2$. As 3, 4, and 9 (pressure control device), regulators were used. As 5, 6 and 10 (flow rate control device), mass flow controllers were used. As 7 (reactor) was used a reactor provided with a SUS316L cylindrical heater having a diameter of 2 inches and a length of 1 m, that can be heated up to 400° C. As 8 (pressure control device) was used a regulator that can control pressure by computer control.

When $ClF_3$ was loaded at 303 sccm and $Cl_2$ at 303 sccm to the reactor (7) heated to 330° C., chlorine fluoride was fed downstream of 7 at a flow rate of 900 sccm. The flow rate was maintained until the feed of the starting material from the $ClF_3$ gas cylinder stopped, and the time that the feed of chlorine fluoride was retained at 900 sccm was 578 hours 10 min. The gas components included in chlorine fluoride fed by this process was analyzed, and the result showed the following: ClF at 99.6181 vol %, $ClF_3$ at 0.0025 vol %, $F_2$ at 0 vol %, $Cl_2$ at 0 vol %, HF at 0.0987 vol %, HCl at 0 vol %, $O_2$ at 0.1401 vol %, $N_2$ at 0.1389 vol %, and $CO_2$ at 0.0012 vol %.

Example 2

The feed time was measured of chlorine fluoride that was made to flow at 900 sccm using a chlorine fluoride feeding device shown in FIG. 2. As 2 (a gas container of material gas that contains chlorine atoms) of FIG. 2 was used a manganese steel 47 L gas cylinder filled with 50 kg of $Cl_2$. As 4 and 9 (pressure control device), regulators were used. As 6 and 10 (flow rate control device), mass flow controllers were used. As 11 (reactor) was used a reactor provided with a SUS316L cylindrical heater having a diameter of 6 inches and a length of 1 m, that can be heated up to 400° C. To this reactor was loaded 40 kg (345 mol) of $CoF_3$. As 8 (pressure control device) was used a regulator that can control pressure by computer control.

When $Cl_2$ was loaded at 455 sccm to the reactor (11) heated to 300° C., chlorine fluoride was fed at a flow rate of 900 sccm. The feed was stopped before $CoF_3$ loaded into the reactor (11) was completely consumed. The time that the feed of chlorine fluoride was retained at 900 sccm was 135 hours 33 min. The gas components included in chlorine fluoride fed by this process was analyzed, and the result showed the following: ClF at 99.3371 vol %, $ClF_3$ at 0.0465 vol %, $F_2$ at 0 vol %, $Cl_2$ at 0 vol %, HF at 0.2057 vol %, HCl at 0 vol %, $O_2$ at 0.1624 vol %, $N_2$ at 0.2460 vol %, and $CO_2$ at 0.0018 vol %.

Example 3

As 1 (a gas container of material gas that contains fluorine atoms) of FIG. 3 was used a manganese steel 47 L gas cylinder filled with 1.44 kg of $F_2$. As 2 (a gas container of material gas that contains chlorine gas) was used a manganese steel 47 L gas cylinder filled with 50 kg of $Cl_2$. As 3, 4 and 9 (pressure control device), regulators were used. As 5, 6 and 10 (flow rate control device), mass flow controllers were used. As 7 (reactor) was used a reactor provided with a SUS316L cylindrical heater having a diameter of 2 inches and a length of 1 m, that can be heated up to 400° C. The generated chlorine fluoride was liquefied by cooling to −100° C. or lower by using a SUS316L pressure container having a cooling mechanism and a temperature adjustment mechanism shown by 12 of FIG. 3. As 3, 4 and 9 (pressure control device), regulators were used. As 5, 6 and 10 (flow rate control device), mass flow controllers were used.

To the reactor (7) heated to 300° C. was loaded $F_2$ at 2000 sccm and $Cl_2$ at 2000 sccm, and the chlorine fluoride obtained downstream of 7 was collected at 12. The collection was ended when 20 fluorine gas cylinders (equivalent to 28.8 kg) were consumed. Then, the temperature of the pressure container was raised gradually, the pressure inside the container was raised to a suitable pressure, and the collected chlorine fluoride was fed at a flow rate of 900 sccm through a mass flow controller 10 in FIG. 3. The time that the feed of chlorine fluoride was retained at 900 sccm was 646 hours 15 min. The gas components included in chlorine fluoride fed by this process was analyzed, and the result showed the following: ClF at 99.8927 vol %, $ClF_3$ at 0.0008 vol %, $F_2$ at 0 vol %, $Cl_2$ at 0 vol %, HF at 0.0158 vol %, HCl at 0 vol %, $O_2$ at 0.0160 vol %, $N_2$ at 0.0744 vol %, $CO_2$ at 0 vol %, and $CF_4$ at 0.0003 vol %.

Reference Example

Figure 5:
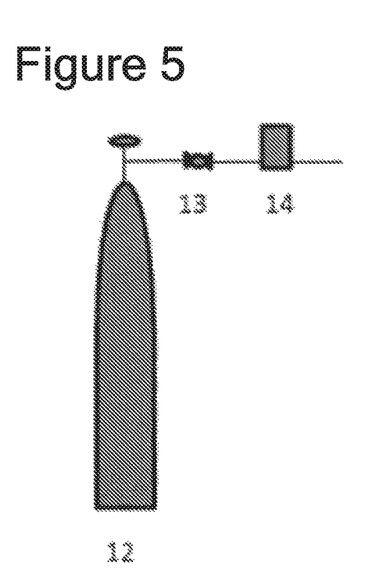
FIG. 5 is a diagram showing an example of a conventional chlorine fluoride feeding device used in the reference example.

To a 47 L SUS gas cylinder collecting 4.2 kg of chlorine fluoride was connected a regulator 13 and a mass flow controller 14 as shown in FIG. 5, and chlorine fluoride was fed at 900 sccm. Consequently, the time that the feed of chlorine fluoride was retained at 900 sccm was 33 hours 5 min.

The present invention further encompasses the following embodiments.

[1] A feeding process of chlorine fluoride gas that feeds chlorine fluoride generated by loading a gas that contains fluorine atoms and a gas that contains chlorine atoms as starting materials into a flow-type heat reactor, the process comprising:

adjusting a flow rate of the gas that contains fluorine atoms and the gas that contains chlorine atoms, which are starting materials, to adjust a flow rate of chlorine fluoride gas to be fed.

[2] A feeding process of chlorine fluoride gas that feeds chlorine fluoride generated by loading a gas that contains fluorine atoms and a gas that contains chlorine atoms as starting materials into a flow-type reactor equipped with a plasma generation device, the process comprising:

adjusting a flow rate of the gas that contains fluorine atoms and the gas that contains chlorine atoms, which are starting materials, to adjust a flow rate of chlorine fluoride gas to be fed.

[3] A feeding process of chlorine fluoride gas that feeds chlorine fluoride generated by loading a gas that contains fluorine atoms and a gas that contains chlorine atoms as starting materials into a flow-type heat reactor, the process provided with: a storage mechanism, situated downstream of the reactor, for storing a generated chlorine fluoride gas by liquefying the generated chlorine fluoride through cooling; a pressure adjustment mechanism, situated further downstream, for adjusting pressure of gas; and a flow rate control mechanism, situated even further downstream, for controlling a gas flow rate, the process comprising:

temporarily liquefying the generated chlorine fluoride gas; and heating the storage mechanism while feeding chlorine fluoride to gasify chlorine fluoride; and feeding chlorine fluoride gas stably by use of the pressure adjustment mechanism and the flow rate control mechanism.

[4] A feeding process of chlorine fluoride gas that feeds chlorine fluoride generated by loading a gas that contains fluorine atoms and a gas that contains chlorine atoms as starting materials into a flow-type reactor equipped with a plasma generation device, the process provided with: a storage mechanism, situated downstream of the reactor, for storing a generated chlorine fluoride gas by liquefying the generated chlorine fluoride gas through cooling; a pressure adjustment mechanism, situated further downstream, for adjusting pressure of gas; and a flow rate control mechanism, situated even further downstream, for controlling a gas flow rate, the process comprising:

temporarily liquefying the generated chlorine fluoride gas; and heating the storage mechanism while feeding chlorine fluoride to gasify chlorine fluoride; and feeding chlorine fluoride gas stably by use of the pressure adjustment mechanism and the flow rate control mechanism.

[5] A feeding process of chlorine fluoride gas that feeds chlorine fluoride generated by loading a gas that contains chlorine atoms into a heat reactor filled with a metal salt that contains fluorine atoms or metal fluorides, which are starting materials, the process comprising:

adjusting a flow rate of the gas that contains chlorine atoms to be loaded to the reactor to adjust the flow rate of the chlorine fluoride gas to be fed.

[6] A feeding process of chlorine fluoride gas that feeds chlorine fluoride generated by loading a gas that contains chlorine atoms into a heat reactor filled with a metal salt that contains fluorine atoms or metal fluorides, which are starting materials, the process provided with: a storage mechanism, situated downstream of the reactor, for storing a generated chlorine fluoride by liquefying the generated chlorine fluoride gas through cooling; a pressure adjustment mechanism, situated further downstream, for adjusting pressure of gas; and a flow rate control mechanism, situated even further downstream, for controlling a gas flow rate, the process also comprising:

temporarily liquefying the generated chlorine fluoride gas; and heating the storage mechanism while feeding chlorine fluoride to gasify chlorine fluoride; and feeding chlorine fluoride gas stably by use of the pressure adjustment mechanism and the flow rate control mechanism.

[7] The feeding process according to any one of [1] to [4], wherein the gas that contains fluorine atoms, which is a starting material, is a compound represented by $XF_n$ (wherein X is Cl, Br or I, and n is an integer of 3 to 7), and the gas that contains chlorine is at least one type of gas selected from $Cl_2$, $NCl_3$, and $BCl_3$.

[8] The feeding process according to [7], wherein the compound represented by $XF_n$ is at least one type of gas selected from $ClF_3$, $ClF_5$, $BrF_3$, $BrF_5$, $IF_5$, and $IF_7$.

[9] The feeding process according to either [5] or [6], wherein a metal salt that contains fluorine atoms, which is a starting material, is at least one type selected from $NaMF_n$ or $KMF_n$ (wherein M is any metal atom, and n is a positive number larger than 0), or metal fluoride salts in which metal fluoride is represented by $MF_n$ (wherein M is any metal atom, and n is a positive number larger than 0), and the gas that contains chlorine is at least one type of gas selected from $Cl_2$, $NCl_3$, $BCl_3$.

[10] A feeding process of chlorine fluoride gas that feeds chlorine fluoride generated by loading a gas that contains fluorine atoms and a gas that contains chlorine atoms as starting materials into a flow-type heat reactor, the process comprising:

passivating a surface inside a heat reactor by loading $F_2$ gas into the heat reactor;

reducing pressure of gases from a gas cylinder of the gas that contains fluorine atoms and a gas cylinder of the gas that contains chlorine atoms by a pressure control mechanism situated immediately downstream of the gas cylinders;

controlling a flow rate of the gas that contains fluorine atoms and a flow rate of the gas that contains chlorine atoms;

heating the heat reactor to 200 to 400° C. and loading the gas that contains fluorine atoms and the gas that contains chlorine atoms to the heat reactor to generate chlorine fluoride;

controlling pressure in the heat reactor by a pressure adjustment mechanism, situated downstream of the heat reactor; and controlling a feed flow rate of chlorine fluoride gas.

[11] A feeding process of chlorine fluoride gas that feeds chlorine fluoride generated by loading a gas that contains chlorine atoms into a heat reactor filled with a metal salt that contains fluorine atoms or metal fluorides, which are starting materials, the process comprising:

passivating a surface on an interior of a heat reactor by loading $F_2$ gas into the heat reactor;

reducing pressure of gas from a gas cylinder of the gas that contains chlorine atoms by a pressure adjustment mechanism situated immediately downstream of the gas cylinder;

controlling a flow rate of the gas that contains chlorine atoms;

heating the heat reactor to 200 to 400° C. and loading the gas that contains chlorine atoms to the heat reactor to generate chlorine fluoride;

controlling pressure in the heat reactor by a pressure adjustment mechanism, situated downstream of the heat reactor; and controlling a feed flow rate of chlorine fluoride.

[12] The feeding process according to any one of [1] to [11], wherein a composition of a generated chlorine fluoride is as follows: ClF at 50.000 to 99.999 vol %, a total amount of halogen molecules represented by $X_2$ (X=F, Cl, Br, I) at 0.000 to 20.000 vol %, $ClF_3$ at 0.000 to 20.000 vol %, a total amount of molecules represented by HX (X=F, Cl, Br, I) at 0.000 to 10.000 vol %, and a balance that contains at least one type of $O_2$, $CO_2$, $N_2$.

[13] A cleaning process comprising cleaning an inside of a semiconductor manufacturing device by a chlorine fluoride gas fed by the feeding process according to any one of [1] to [11].

[14] An etching process comprising etching a surface of a semiconductor substrate by a chlorine fluoride gas fed by the feeding process according to any one of [1] to [11].

[15] An organic synthesis process that uses chlorine fluoride gas fed by the feeding process according to any one of [1] to [11] in an organic synthesis reaction.

[16] A fluorinating process comprising subjecting a reaction substrate to a fluorination reaction using a chlorine fluoride gas fed by the feeding process according to any one of [1] to [11].

The invention claimed is:

1. A feeding process of chlorine fluoride that feeds chlorine fluoride generated by loading a gas that contains $ClF_3$ and a gas that contains $Cl_2$ as starting materials into a flow-type reactor, the process comprising:

adjusting a flow rate of the gas that contains $ClF_3$ and the gas that contains $Cl_2$, which are starting materials, and heating the flow-type reactor to 200 to 400° C. and loading the gas that contains $ClF_3$ and the gas that contains $Cl_2$ to the flow-type reactor to generate chlorine fluoride and to adjust a flow rate of generated chlorine fluoride to be fed, wherein the generated chlorine fluoride comprises ClF at 50.000 to 99.999 vol %.

2. The feeding process according to claim 1, wherein the flow-type reactor is at least one type selected from a group consisting of a flow-type heat reactor and a flow-type reactor equipped with a plasma generation device.

3. The feeding process according to claim 1 provided with: a storage mechanism, situated downstream of the reactor, for storing a generated chlorine fluoride by liquefying the generated chlorine fluoride through cooling; a pressure adjustment mechanism, situated further downstream, for adjusting pressure of gas; and a flow rate control mechanism, situated even further downstream, for controlling a gas flow rate, the process comprising:

temporarily liquefying the generated chlorine fluoride; and heating the storage mechanism when feeding chlorine fluoride to gasify chlorine fluoride; and feeding chlorine fluoride stably by use of the pressure adjustment mechanism and the flow rate control mechanism.

4. The feeding process according to claim 1, comprising:

passivating a surface inside a heat reactor by loading $F_2$ gas into the heat reactor;

reducing pressure of gases from a gas cylinder of the gas that contains $ClF_3$ and a gas cylinder of the gas that contains $Cl_2$ by a pressure control mechanism situated immediately downstream of the gas cylinders;

controlling the flow rate of the gas that contains $ClF_3$ and the flow rate of the gas that contains $Cl_2$;

heating the heat reactor to 200 to 400° C. and loading the gas that contains $ClF_3$ and the gas that contains $Cl_2$ to the heat reactor to generate chlorine fluoride;

controlling pressure in the heat reactor by a pressure adjustment mechanism, situated downstream of the heat reactor; and controlling a feed flow rate of chlorine fluoride.

5. The feeding process according to claim 1, wherein a composition of a generated chlorine fluoride is as follows: ClF at 50.000 to 99.999 vol %, a total amount of halogen molecules represented by $X_2$ (X=F, Cl, Br, I) at 0.000 to 20.000 vol %, $ClF_3$ at 0.000 to 20.000 vol %, a total amount of molecules represented by HX (X=F, Cl, Br, I) at 0.000 to 10.000 vol %, and a balance that contains at least one type of $O_2$, $CO_2$, $N_2$.

6. A cleaning process comprising cleaning an inside of a semiconductor manufacturing device by chlorine fluoride fed by the feeding process according to claim 1.

7. An etching process comprising etching a surface of a semiconductor substrate by chlorine fluoride fed by the feeding process according to claim 1.

8. An organic synthesis process that uses chlorine fluoride fed by the feeding process according to claim 1 in an organic synthesis reaction.

9. A fluorinating process comprising subjecting a reaction substrate to a fluorination reaction using chlorine fluoride fed by the feeding process according to claim 1.

10. The feeding process according to claim 1, wherein the flow-type reactor is heated to 200 to 330° C.

11. A feeding process of chlorine fluoride that feeds chlorine fluoride generated by loading a gas that contains chlorine atoms into a heat reactor which is loaded with $CoF_3$ as a starting material, the process comprising:

adjusting a flow rate of the gas that contains chlorine atoms to be loaded to the reactor to adjust a flow rate of the generated chlorine fluoride to be fed, wherein the generated chlorine fluoride comprises ClF at 50.000 to 99.999 vol %.

12. The feeding process according to claim 11 provided with: a storage mechanism, situated downstream of the reactor, for storing a generated chlorine fluoride by liquefying the generated chlorine fluoride through cooling; a pressure adjustment mechanism, situated further downstream, for adjusting pressure of gas; and a flow rate control mechanism, situated even further downstream, for controlling a gas flow rate, the process comprising:

temporarily liquefying the generated chlorine fluoride; and heating the storage mechanism when feeding chlorine fluoride to gasify chlorine fluoride; and feeding chlorine fluoride stably by use of the pressure adjustment mechanism and the flow rate control mechanism.

13. The feeding process according to claim 11, wherein the gas that contains chlorine is $Cl_2$.

14. The feeding process according to claim 11, comprising:

passivating a surface inside a heat reactor by loading $F_2$ gas into the heat reactor;

reducing pressure of gas from a gas cylinder of the gas that contains chlorine atoms by a pressure adjustment mechanism situated immediately downstream of the gas cylinder;

controlling the flow rate of the gas that contains chlorine atoms;

heating the heat reactor to 200 to 400° C. and loading the gas that contains chlorine atoms to the heat reactor to generate chlorine fluoride;

controlling pressure in the heat reactor by a pressure adjustment mechanism, situated downstream of the heat reactor; and controlling a feed flow rate of chlorine fluoride.

* * * * *